United States Patent [19]
Bose et al.

[11] Patent Number: 4,944,018
[45] Date of Patent: Jul. 24, 1990

[54] SPEED CONTROLLED AMPLIFYING

[75] Inventors: Amar G. Bose, Wayland; Joseph L. Veranth, Southborough, both of Mass.

[73] Assignee: Bose Corporation, Framingham, Mass.

[21] Appl. No.: 383,295

[22] Filed: Jul. 18, 1989

Related U.S. Application Data

[63] Continuation of Ser. No. 177,443, Apr. 4, 1988, abandoned, which is a continuation-in-part of Ser. No. 465,818, Feb. 14, 1983, abandoned.

[51] Int. Cl.$^5$ .............................................. H03G 3/20
[52] U.S. Cl. ........................................ 381/86; 381/57; 381/102; 455/238
[58] Field of Search ................ 381/106, 98, 104, 61, 381/56, 57, 102, 86, 103, 107, 108; 455/238, 246, 247, 297, 242; 333/14

[56] References Cited

U.S. PATENT DOCUMENTS

| | | | |
|---|---|---|---|
| 4,076,959 | 2/1978 | Gilbert et al. | 381/101 X |
| 4,400,583 | 8/1983 | Bloy | 381/98 |
| 4,476,571 | 10/1984 | Tokumo et al. | 381/57 |
| 4,641,344 | 2/1987 | Kusai et al. | 381/86 X |
| 4,823,392 | 4/1989 | Walker | 381/106 |

FOREIGN PATENT DOCUMENTS

2178259 2/1987 United Kingdom ................ 381/106

Primary Examiner—James L. Dwyer
Attorney, Agent, or Firm—Fish & Richardson

[57] ABSTRACT

A vehicle has an engine and a sound amplifying system characterized by a frequency response including a signal source and a manually operable sound level setting control that establishes the sound level of the desired signal in the vehicle, a power amplifier and an electroacoustical transducer. The manually operable sound level setting control comprises a dynamic equalization circuit for providing a predetermined equalization over the bass frequency range depending on the sound level setting of the sound level setting control. A variable gain device associated with the sound level setting control responds to an input electrical audio signal to be amplified by the system for providing a signal of controlled amplitude. The variable gain device controls the gain of the system to increase and decrease in response to the engine being on and off respectively. The manually operable sound level setting control changes the frequency response of the system when altering the gain of the system much more significantly than when the variable gain device alters the gain such that the frequency response with the engine being on is always different from the frequency response with the engine being off.

12 Claims, 6 Drawing Sheets

SPEED CONTROLLED AMPLIFYING

This application is a continuation of U.S. Ser. No. 177,443 filed 4-4-88, now abandoned, which is a continuation-in-part of U.S. application Ser. No. 465,818 filed Feb. 14, 1983, now abandoned.

The present invention relates in general to amplification in a vehicle and more particularly concerns novel apparatus and techniques for adjusting gain as a function of speed and/or vehicle engine condition and/or input signal level.

Vehicles, such as automobiles, are subject to external noises, both from the engine and from noise caused by movement, such as road noise. These noises contribute to the ambient noise level inside the vehicle that masks desired sound, resulting in an alteration of the perceived tonal balance and a loss of very low level passages in reproduced music. Merely boosting bass does not solve the problem because merely boosting the bass decreases the perceived intelligibility. Simply increasing the volume does not solve the problem because there is a loss of perceived bass, as explained in the parent application. That application described apparatus and techniques for using dynamic equalization to increase gain as a function of car speed so as to override low frequency noise spectral components without reducing intelligibility.

The effect of external noise upon the perception of reproduced sound in a vehicle is dependent upon several factors besides those that affect the noise itself. This effect depends upon the loudness of the sound being reproduced, since soft passages of music or voice will be more strongly affected by the background noise level than will loud passages. The effect also depends upon the past history of the noise environment, since the human perception mechanism changes in response to prolonged noise exposure. This property results in increased requirement for reproduced level after long exposure to noise.

It is an important object of this invention to provide improved apparatus and techniques for sound amplification in vehicles.

According to one aspect of the invention, there is means for increasing the amplification gain in response to the vehicle engine operating and reducing this gain in response to the engine not operating. According to another aspect of the invention, there is means for delaying gain changes in response to speed changes. According to still another aspect of the invention, there is means responsive to the engine operating condition and/or vehicle speed and/or human-controlled setting for compressing the dynamic range of the amplified audio signal to fit within the window available to the listener in the vehicle above the ambient noise.

Numerous other objects, features and advantages of the invention will become apparent from the following specification when read in connection with the accompanying drawing in which.

Figure 1:
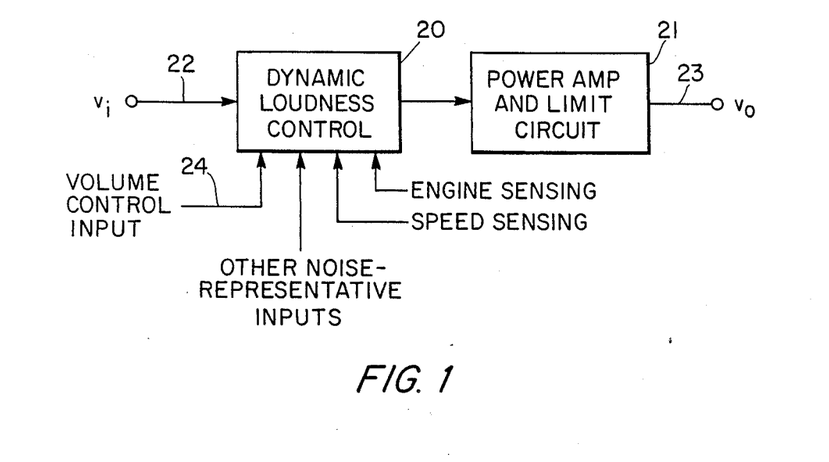
FIG. 1 is a block diagram illustrating the key signals associated with a system according to the invention.

With reference now to the drawing, and more particularly FIG. 1 thereof, there is shown a block diagram illustrating the logical arrangement of a system according to the invention in which the sound signal to be amplified passes through a dynamic loudness control 20 cascaded with a power amplifier and limiting circuit 21 from input terminal 22 to output terminal 23. Dynamic loudness control 20 may comprise a system such as disclosed in the aforesaid copending patent application including a manual sound level setting control 24. The dynamic loudness control may comprise circuitry to perform various functions in a manner described below.

Figure 2:
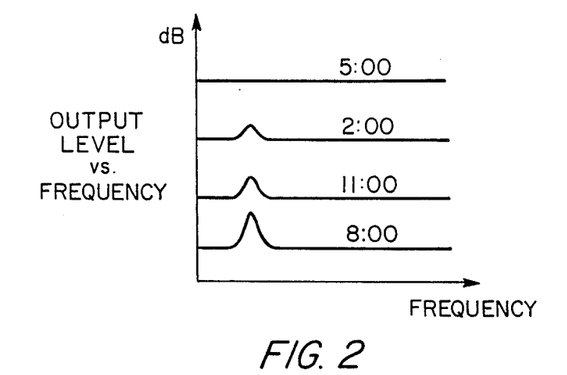
FIG. 2 is a graphical representation of the output level of the dynamic loudness control part of the system, as a function of frequency, for various volume control settings, while holding the input level fixed.

Referring to FIG. 2, there is shown a graphical representation of the frequency response of the dynamic loudness control 20 for different manual volume control settings, while holding other vehicle operating conditions fixed, which may correspond substantially to the system disclosed in the aforesaid copending U.S. application Ser. No. 06/465,818 filed Feb. 14, 1983. As the manually selected gain increases, the low frequency peak amplitude relative to that at midband decreases.

Figure 3:
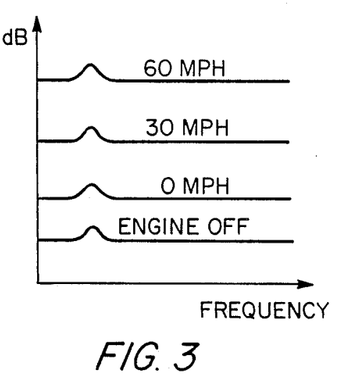
FIG. 3 is a graphical representation of the output level of the same part of the system, as a function of frequency, for various vehicle operating conditions, while holding the input level fixed.

Referring to FIG. 3, there is shown a graphical representation of gains as a function of frequency for the dynamic loudness control 20 while holding the manual gain control fixed and varying the vehicle operating conditions. A key characteristic of the system is that the frequency response changes much more significantly when the gain is changed by means of the manual volume control 24 than when the gain is changed as a result of changing vehicle operating conditions. More generally, the effect of the dynamic loudness control 20 having the characteristics shown in FIGS. 2 and 3 is to shift the overall system response so that none of the curves in FIG. 2 with the engine off can be made to line up with any of the equivalent engine-on curves by any adjustment of the manually adjusted gain control.

Figure 4:
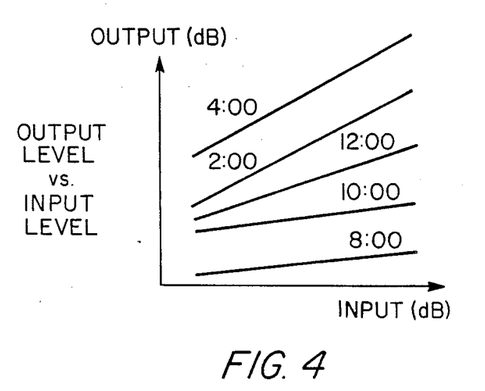
FIG. 4 is a graphical representation of the output level of the same part of the circuit, as a function of input level, for various loudness-control settings, while holding the frequency fixed.

Referring to FIG. 4, there is shown a graphical representation of output as a function of input, both in dB, for different gain-control settings, while holding vehicle operating conditions fixed, representing a compressing arrangement desirable under conditions of increased noise, such as high speed and/or engine running. As the gain control is rotated, the output is increased more significantly for pianissimo, or low level, passages, than for fortissimo, or high level, passages.

Figure 5:
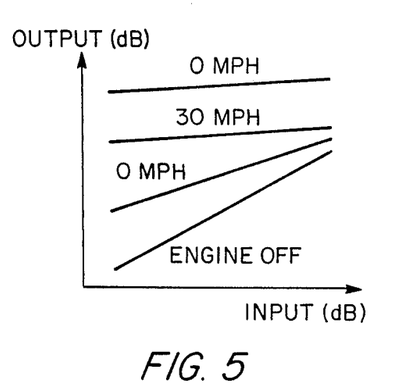
FIG. 5 is a graphical representation of the output level of this same part of the circuit, as a function of input level, for various vehicle operating conditions, while holding frequency fixed.

Referring to FIG. 5, there is shown a graphical representation of output as a function of input, both in dB, for different vehicle operating conditions while holding volume control setting fixed. The least output occurs with engine off while the greatest output occurs with the engine on at the highest vehicle speed, shown to be typically 60 mph. In this case, as the ambient noise level increases, the gain for pianissimo passages of music or other sound increases more than for fortissimo passages so that in a very noisy situation where the total dynamic range of the system available to the listener is limited to that between the ambient noise and the maximum output of the vehicle sound system, the dynamic range of the input music or other sound signal is effectively mapped into the dynamic range then available in the vehicle. Preferably, the dynamic loudness control 20 includes means, such as a suitable RC circuit, for delaying gain changes to allow the listener to accommodate to the ambient noise level changes. This delay is typically seconds for an increase, and many seconds for a decrease, corresponding to the time for a human to adapt to the changed ambient noise level.

Figures 6, 7:
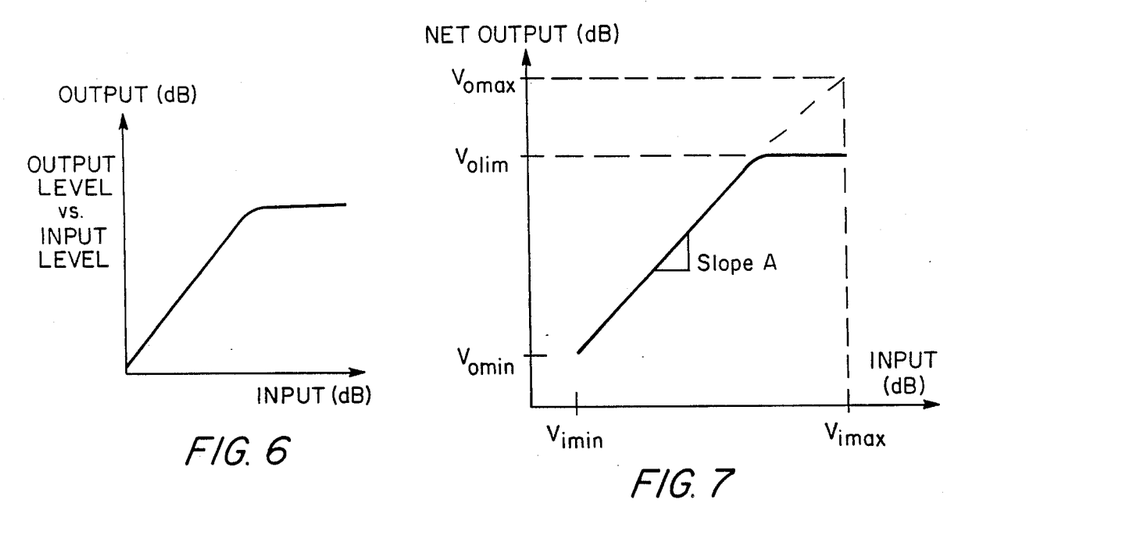
FIG. 6 is a graphical representation of the output level of the power amplifier and limiter circuit as a function of input level for a fixed frequency.
FIG. 7 is a graphical representation of the output level of the composite circuit as a function of input level for a given loudness-control setting and set of vehicle conditions.

Referring to FIG. 6, there is shown a graphical representation of the output of the power amplifier and compressor, both in dB, at a fixed frequency, representing a limiting of the signal to prevent severe distortion when the maximum power output capability of the amplifier is reached.

Referring to FIG. 7, there is shown a graphical representation of the output level of the complete circuit as a function of input level, at a given frequency, volume-control setting, and set of vehicle conditions, where the voltages shown are representative of the signal levels in dB. For any such specific set of circumstances the output level will be a function of input level, which is assumed to vary for differing musical passages between $V_{imin}$ and $V_{imax}$. For the softest music or voice passages, when the input to the circuit is at $V_{imin}$, the output level is $V_{omin}$. As the input level is increased, the output level also increases, following a curve of average slope, A, such that when the input level reaches its maximum value, $V_{imax}$, during loud passages, the output level normally reaches a value of $V_{omax}$. Under some conditions, such as high volume control settings or noisy car conditions, the amplifier may reach the limiting point, $V_{olim}$, prior to the input level reaching its maximum.

Each set of operating characteristics defined by a volume-control setting and vehicle conditions, such as speed and battery voltage, will have associated with it its own values of $V_{omin}$, $V_{omax}$, and $V_{olim}$. The characteristic of the circuit of the present invention is that $V_{omin}$ is strongly dependent upon vehicle conditions and weakly dependent upon volume-control setting, and $V_{omax}$ is strongly dependent upon volume-control settings and weakly dependent upon vehicle conditions. $V_{olim}$ is mostly a function of battery voltage and amplifier capability. The slope A may be restricted to avoid artifact associated with excessive compression or expansion.

As an example, with a compact disc as the source, the input may have a dynamic range of 90 dB corresponding to a $V_{imin}$ of 1 volt and a $V_{imax}$ of 10 volts. In a stationary car in the showroom with the engine off, the listenable dynamic range may be 80 dB, from 40 dB SPL noise level to 120 dB SPL maximum amplifier output with the volume control adjusted to just short of clipping. This could correspond to a $V_{omin}$ of 1 volt and a $V_{omax}$ of 9 volts. Turning the volume control up further may raise $V_{omax}$ from 9 volts to 10 volts, but if $V_{olim}$ is set at 9 volts, this will not result in an increase in output level on loud passages. Turning the volume control down, on the other hand, may lower $V_{omax}$ to 6 volts, but have no effect upon $V_{omin}$, resulting in a sound level varying from 40 dB SPL on soft passages to 90 dB SPL on loud passages. Driving the car may raise the noise level to 70 dB SPL. This might cause $V_{omax}$ to be raised slightly from 6 volts to 7 volts, but $V_{omin}$ may be raised from 1 volt to 4 volts. Thus, the reproduced music level would vary from 70 dB SPL on soft passages to 100 dB SPL on loud passages.

More precisely, if using the convention that:

$x_i$ = instantaneous input signal (1)

$x_o$ = instantaneous output signal (2)

$v_i$ = level of input signal (e.g. rectified & filtered $x_i$) (3)

$v_o$ = level of output signal (4)

$V_i = \log(v_i)$ (5)

$V_o = \log(v_o)$ (6)

Then the characteristic of FIG. 7 can be expressed as:

$V_o = V_{omax} - A(V_{imax} - V_i)$ (7)

where $$A = \frac{V_{omax} - V_{omin}}{V_{imax} - V_{imin}}$$ (8)

Figure 8:
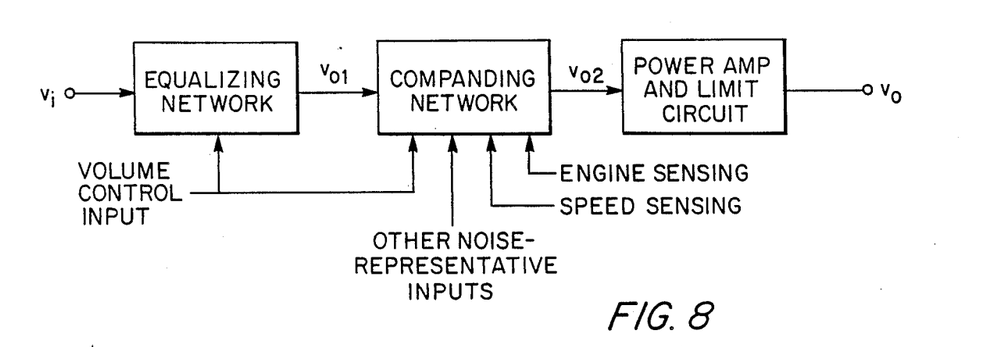
FIG. 8 is a block diagram illustrating a circuit arrangement for dividing the automatic loudness circuit into an equalizing and a companion part.

Referring to FIG. 8, there is shown a block diagram illustrating a partitioning of the circuit for convenience, where the equalizing part is separated from the companding part. The companding part primarily compensates for vehicle conditions, but has flat frequency response. In this case the circuit is described by the equations:

$V_{o1} = V_{oc} + V_i - V_{imax}$ (9)

$V_{o2} = V_{omax} - A(V_{oc} - V_{o1})$ (10)

In this partitioning, the primary function of the volume control for adjusting the gain of the circuit by changing $V_{omax}$ in response to changes in the setting of volume control 24 manifested as changes in control voltage $V_{oc}$ is incorporated into the equalizing part of the circuit.

Figure 9:
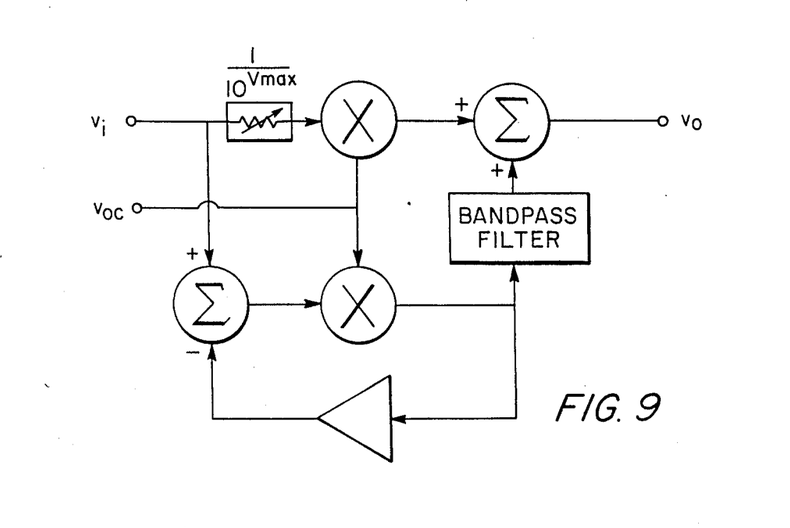
FIG. 9 is a schematic representation of a circuit for achieving the equalization function along with gain control.

Referring to FIG. 9, there is shown a block diagram illustrating the logical arrangement of an exemplary embodiment of the frequency-shaping part of the circuit defined by equation 9. The bandpass filter of FIG. 9 preferably has a gain greater than unity in the pass band.

Figure 10:
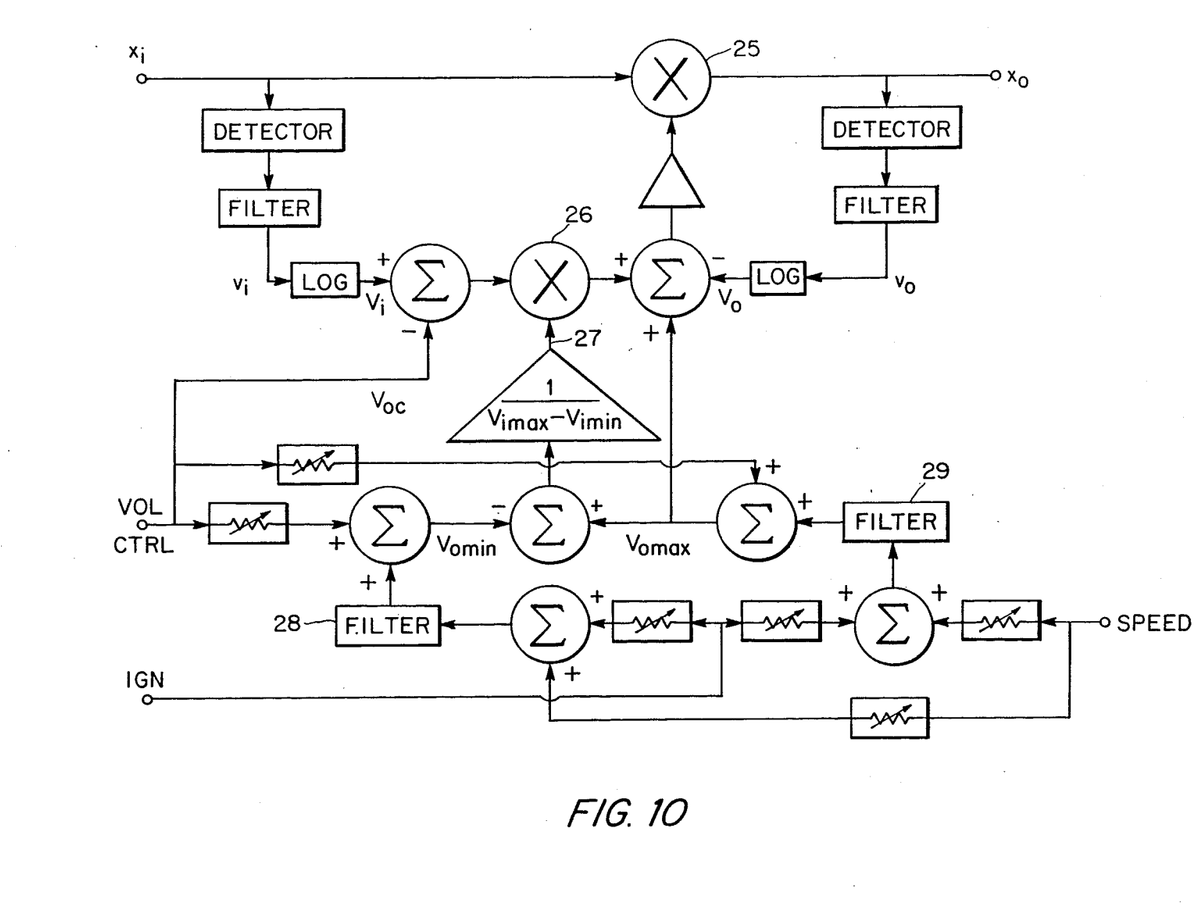
FIG. 10 is a schematic representation of a circuit for achieving the companding part of the circuit.

Referring to FIG. 10, there is shown a block diagram illustrating the logical arrangement of an exemplary embodiment of the automatic dynamic equalizing part of the circuit defined by equation 10. The gain of the circuit for an input signal $v_i$ is set by multiplier 25, and the compression or expansion of dynamic range is set by multiplier 26, responsive to signal 27 which may be limited to avoid artifact associated with excessive compression or expansion.

Figure 11:
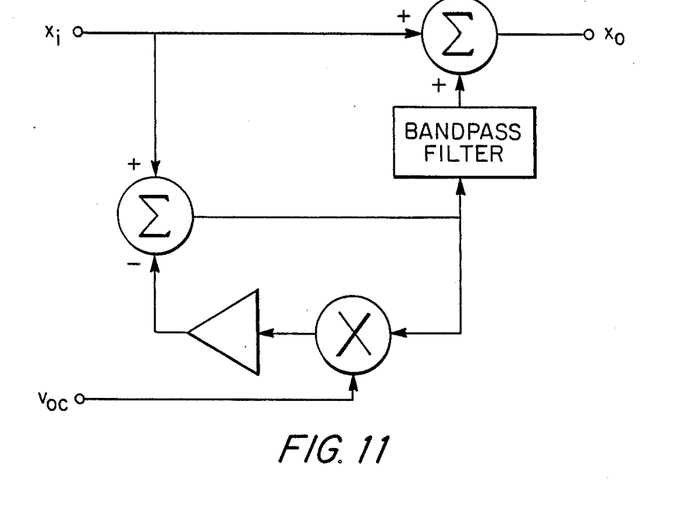
FIG. 11 is a schematic representation of a circuit for achieving the equalization function without gain control.

In an alternate embodiment, the equalizing part of the circuit may have a constant gain, independent of volume-control setting, and the primary function of the volume control may be performed by the automatic dynamic equalizing part of the circuit. Referring to FIG. 11, there is shown a block diagram illustrating the logical arrangement of an exemplary embodiment of the equalizing part of such a circuit.

Figure 12:
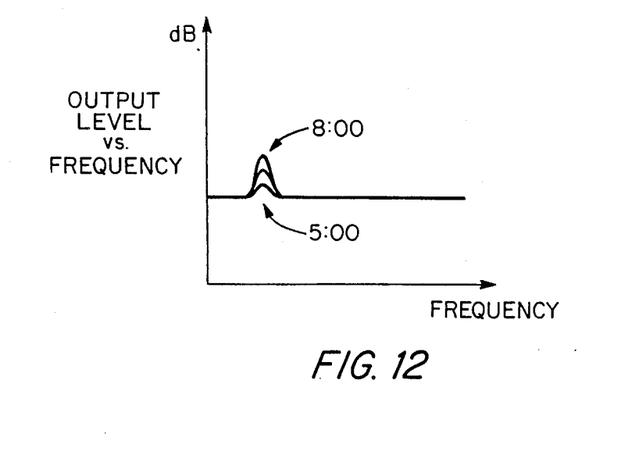
FIG. 12 is a graphical representation of the response of the equalizing circuit without gain control.

Referring to FIG. 12, there is shown a graphical representation of the output level of this part of the circuit as a function of frequency, as the volume control is changed, while holding input level and vehicle conditions fixed. In this case the volume control affects only the frequency response of this part of the circuit and not the gain. Mathematically, this circuit ay be described by the equation:

$$V_{ol} = V_i \quad (11)$$

The corresponding companding part of the circuit would be represented by equation 7.

Figure 13:
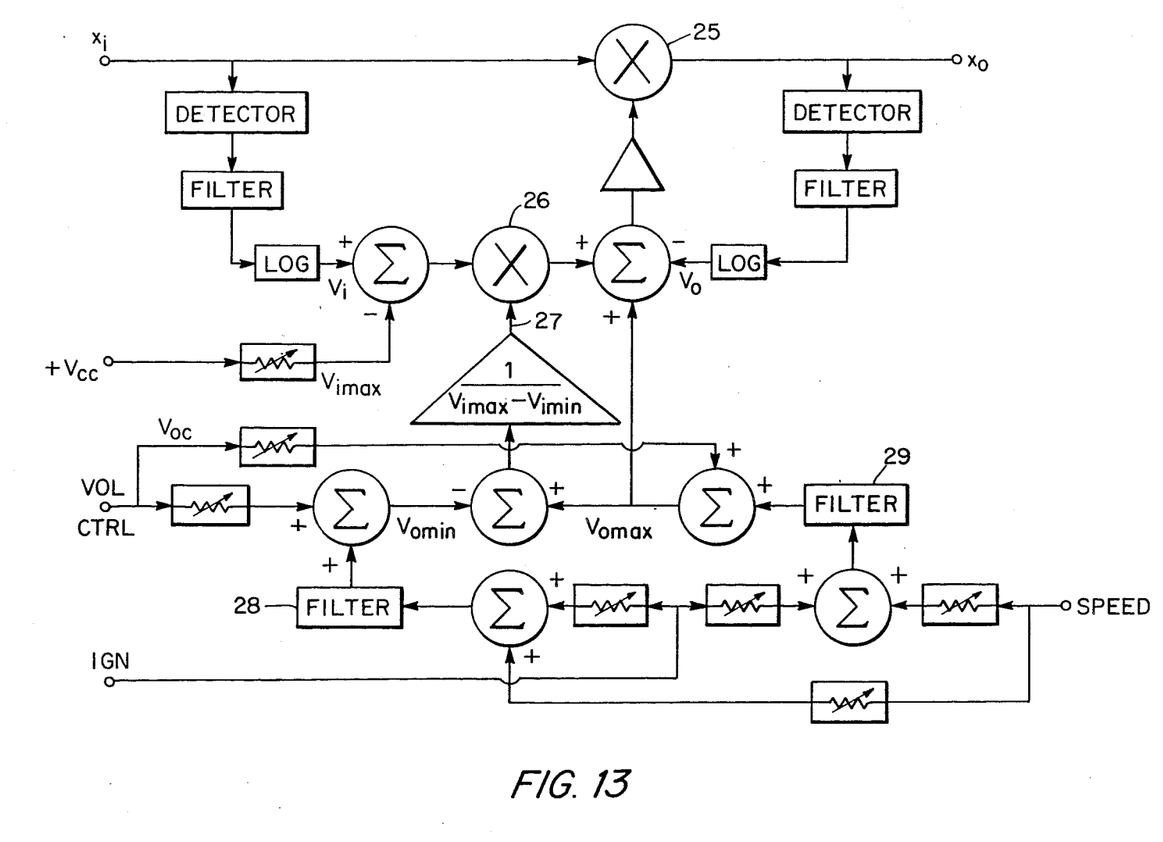
FIG. 13 is a schematic representation of a circuit for achieving the companding part of the circuit including gain control.

Referring to FIG. 13, there is shown a block diagram illustrating the logical arrangement of an exemplary embodiment of the companding part of the circuit corresponding to this partitioning. It is desirable for the dynamic loudness control to respond instantly to changes in the volume control setting 24. On the other hand, response to changes in vehicle conditions should occur only with a delay corresponding to the adaptation time of human perception. This is accomplished by means of filters 28 and 29, which may be simple RC networks or more complicated networks with different delay times for increasing signals than for decreasing signals.

The example just given assumes a perfectly linear control function as illustrated by slope A of FIG. 7, and the invention embraces more complicated control functions.

Figure 14:
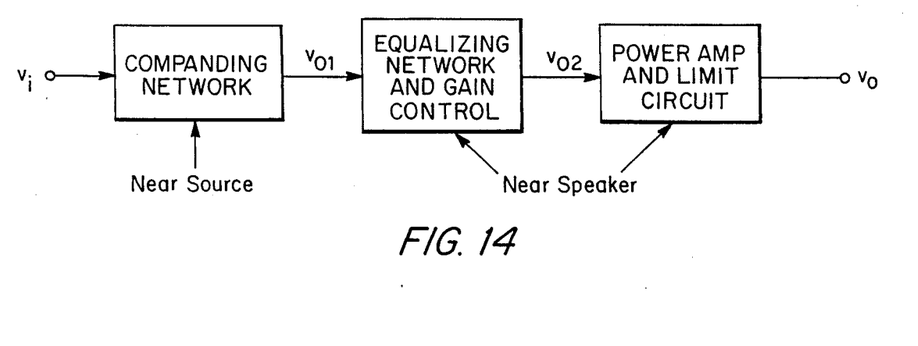
FIG. 14 is a block diagram illustrating a partitioning of the circuit with a portion near the source and a portion near the speaker.

Referring to FIG. 14, there is shown a block diagram of another embodiment of the invention comprising a part located near the source and a part located near the speaker. In Bose U.S. Pat. No. 4,282,605 granted Aug. 4, 1981, there is described some of the advantages associated with locating the amplifier with the speaker. In an automotive sound system there exists the danger of the lines between the signal source, such as the tuner, cassette or compact disc player, and the power amplifier receiving undesired noise. If the volume control is located at the source end, then when the volume control is set for a low volume, these lines carry the desired signal at low level so that a small amount of picked-up noise may be audible. If instead, the volume control is located at the location of the remote speaker and amplifier, as illustrated in FIG. 14, then the level of the desired signal on the lines from the source to the speaker amplifier may always be at a much higher level. Therefore this feature significantly reduces the effect of noise pickup.

Similarly, if the companding part of the circuit is located at the location of the remote speakers, when the vehicle operating conditions call for increased level during soft music passages, the picked-up noise will be increased, whereas if the companding part of the circuit is located at the location of the source, as illustrated in FIG. 14, then the signal will be increased, but the effect of the picked-up noise will remain constant. In this case, the equalizing circuit with gain control, as shown in FIG. 9 is best used at the location of the speaker. The characteristic of the circuit can then be described by the equations:

$$V_{ol} = V_{imax} - A(V_{imax} - V_i) \quad (12)$$

$$V_{o2} = V_{ol} + V_{omax} - V_{imax} \quad (13)$$

In this embodiment both the volume-control signal and the vehicle-condition signal(s) are supplied to both the location of the source and the location of the speakers. Another alternative may be understood by realizing that since $V_{omax}$ is less strongly affected by vehicle conditions than by volume-control setting, this dependency may be incorporated into the circuit located near the source with minimum penalty in electrical noise sensitivity, so that the equations become:

$$V_{ol} = V_{omax} + V_{imax} - V_{oc} - A(V_{imax} - V_i) \quad (14)$$

$$V_{o2} = V_{01} + V_{oc} - V_{ima}x \quad (15)$$

Figure 15:
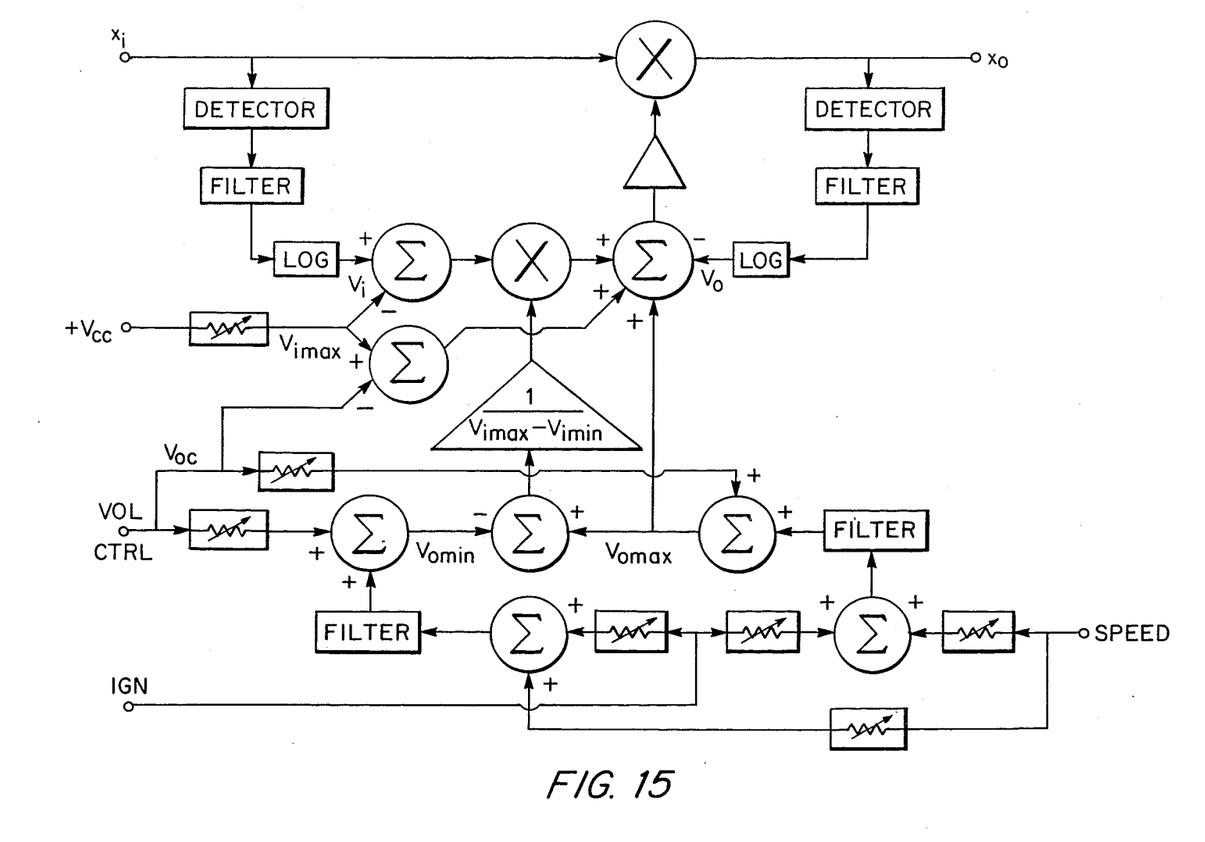
FIG. 15 is a schematic representation of the companding part of the circuit which would be located near the source.

Referring to FIG. 15, there is shown a block diagram illustrating the logical arrangement of an exemplary embodiment of the companding part of the circuit as described by equation 14. The circuit used to realize the corresponding equalizing function with volume control as described by equation 15 is the same as that shown in FIG. 9.

There has been described novel apparatus and techniques for improving the sound perceived in a vehicle under conditions of ambient noise. It is apparent that those skilled in the art may now make numerous uses and modifications of and departures from the specific embodiments described herein without departing from the inventive concepts. Consequently, the invention is to be construed as embracing each and every novel feature and novel combination of features present in or possessed by the apparatus and techniques herein disclosed and limited solely by the spirit and scope of the appended claims.

What is claimed is:

1. In a vehicle having an engine for powering the vehicle and a sound amplifying system characterized by a frequency response including a signal source and having a manually operable sound level setting control means for establishing the sound level of a desired signal in said vehicle, a power amplifier and electroacoustical transducing means, the improvement comprising, a source of an engine signal representative of the on and off condition of said engine, variable gain means associated with said sound level setting control means responsive to an input electrical audio signal to be amplified by said system for providing a signal of controlled amplitude, wherein said manually operable sound level setting control means comprises a manual control and, dynamic equalization circuit means for providing a predetermined equalization over the bases frequency range depending on the sound level setting of said manual control.

said variable gain means being responsive to said engine signal for controlling the gain of said system to increase and decrease in response to said engine being on and off respectively, said manually operable sound level setting control means including means for changing the frequency response of said system when altering the gain of said system much more significantly than when said variable gain means alters said gain such that said frequency response with the engine being on is always different from said frequency with the engine being off.

2. The improvement in accordance with claim 1 and further comprising, a source of a vehicle speed signal representative of the speed of said vehicle, said variable gain means also being responsive to said vehicle speed signal for controlling the gain of said system to increase and decrease with increasing and decreasing vehicle speed respectively.

3. In a vehicle having an engine for powering the vehicle and a sound amplifying system including a signal source and having a manually operable sound level setting control means for establishing the sound level of a desired signal in said vehicle, a power amplifier and electroacoustical transducing means, the improvement comprising, a source of a signal representative of the acoustic noise level condition of vehicle operation, variable gain means associated with said sound level setting control means for receiving an input electrical audio signal to be amplified by said system for providing a signal of controlled amplitude, said variable gain means being responsive to said noise-representative signal for controlling the gain of said system to increase and decease in response to said noise increasing or decreasing respectively, and means for establishing the gain of said system higher for low level input signal than for higher level input signals so that the effective dynamic range of said system is less than that of an input signal applied at the input so that for the lowest expected input signal level, the output provided by said system is comparable to the ambient noise level in said vehicle.

4. The improvement in accordance with claim 3 wherein said manually operable sound level setting control means comprises a manual control and dynamic equalization circuit means for providing a predetermined equalization over the bass frequency range depending on the sound level setting of said manual control.

5. In a vehicle having an engine for powering the vehicle and a sound amplifying system including a signal source and having a manually operable sound level setting control means for establishing the sound level of a desired signal in said vehicle, a power amplifier and electroacoustical transducing means, the improvement comprising, a source of a signal representative of the acoustic noise level condition of vehicle operation, variable gain means responsive to said sound level setting control means, said noise-representative signal and said signal source for establishing the sound level in said vehicle for low-level audio signals and for high-level audio signals so that said response to low level signals is primarily determined by said noise-representative signal and said response to high-level signals is primarily determined by said sound level setting control means.

6. Apparatus in accordance with claim 5 and further comprising a delay means for delaying a change in the system gain in response to said noise-representative signal by an amount corresponding substantially to human adaptation time.

7. In a sound amplifying system including a manually operable sound level setting control means for establishing the sound level of a desired signal, the improvement comprising, variable gain means having an input and an output, and associated with said sound level setting control means, said variable gain means receiving an input electrical audio signal on said input to be amplified by said system for providing a signal of controlled amplitude, said means responsive to the setting of said manually operable sound level setting control means for establishing the difference between the gain of said system for low level input signals and the gain of said system for high level input signals so that said difference is dependent upon said setting.

8. In a sound amplifying system having a manually operable sound level setting control means and a compressor characterized by a slope related to the degree of compression introduced, the improvement comprising, means for varying the slope of said compressor in accordance with the setting of said manually operable sound level setting control means.

9. The improvement in accordance with claim 7 wherein said manually operable sound level setting control means comprises a manual control and dynamic equalization circuit means for providing a predetermined equalization over the bass frequency range depending on the sound level setting of said manual control, 10. The improvement in accordance with claim 8 wherein said manually operable sound level setting control means comprises a manual control and dynamic equalization circuit means for providing a predetermined equalization circuit means for providing a predetermined equalization over the bass frequency range depending on the sound level setting of said manual control.

11. In a sound amplifying system which receives an input signal and provides an output signal and includes a manually operable sound level setting control for manually establishing the sound level of the output signal, the improvement comprising, a compressor characterized by a different gain for high-level signals than for low level signals, and means responsive to the setting of said sound level setting control for establishing the difference in the gain for high level signals and the gain for low level signals dependent upon said setting of said sound level setting control.

12. The improvement in accordance with claim 10 wherein said sound level setting control comprises dynamic equalization circuitry for providing a predetermined equalization over the bass frequency range dependent upon said setting of said sound level setting control.

* * * * *

UNITED STATES PATENT AND TRADEMARK OFFICE
CERTIFICATE OF CORRECTION

PATENT NO.   :   4,944,018
DATED        :   July 24, 1990
INVENTOR(S)  :   Amar G. Bose et al.

It is certified that error appears in the above-identified patent and that said Letters Patent is hereby corrected as shown below:

In column 7, line 15, "frequency" should read --frequency response--.

Signed and Sealed this

Twenty-second Day of September, 1992

Attest:

DOUGLAS B. COMER

Attesting Officer     Acting Commissioner of Patents and Trademarks